United States Patent
Tonami et al.

(10) Patent No.: US 7,919,757 B2
(45) Date of Patent: Apr. 5, 2011

(54) RADIATION DETECTOR

(75) Inventors: Hiromichi Tonami, Kyoto (JP); Junichi Ohi, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 359 days.

(21) Appl. No.: 12/295,608

(22) PCT Filed: Apr. 4, 2006

(86) PCT No.: PCT/JP2006/307083
§ 371 (c)(1),
(2), (4) Date: Sep. 30, 2008

(87) PCT Pub. No.: WO2007/113898
PCT Pub. Date: Oct. 11, 2007

(65) Prior Publication Data
US 2010/0237251 A1    Sep. 23, 2010

(51) Int. Cl.
*G01T 1/20*    (2006.01)
(52) U.S. Cl. ................................. 250/368; 250/361 R
(58) Field of Classification Search ............. 250/363.02, 250/363.03, 363.04, 368, 361 R, 370.1, 370.11
See application file for complete search history.

(56) References Cited

U.S. PATENT DOCUMENTS 5,146,296 A * 9/1992 Huth ............................. 257/429
6,552,348 B2 * 4/2003 Cherry et al. ............ 250/363.03

FOREIGN PATENT DOCUMENTS

JP        08327744 A  * 12/1996
JP        2004-354343    12/2004

* cited by examiner

*Primary Examiner* — David P Porta
*Assistant Examiner* — Faye Boosalis
(74) *Attorney, Agent, or Firm* — J.C. Patents

(57) ABSTRACT

A thin radiation detector with a high sensitivity is described. The radiation detector has light receiving elements receiving lights emitted by scintillators, performs a photoelectric conversion by using an avalanche multiplication film formed by amorphous selenium, and reads signals by using electron beams constantly discharged from a plurality of electron beam emitting sources called as a field emission array. The avalanche multiplication film formed by amorphous selenium is quite thin and has a simple structure, so it can be formed compactly and realized at a low cost. In addition, a signal amplification degree is approximately 1000 times, so an expensive low noise amplifier or a dedicated temperature adjusting mechanism is not required, and a quantum efficiency is sufficient for a wavelength of 300~400 nm.

2 Claims, 4 Drawing Sheets

RADIATION DETECTOR

BACKGROUND OF THE INVENTION

1. Field of the Invention

The present invention generally relates to a radiation detector, for example, applied to a positron emission tomography (PET) device, a single photon emission computed tomography (SPECT) device, or other medical diagnostic devices, in which the device detects a radioactive ray (gamma ray) discharged from radioactive isotopes (RIs) that are administered to a to-be-tested object and accumulated in a target site, so as to obtain an RI distribution tomogram of the target site.

2. Description of Related Art

The radiation detector includes scintillators that become luminescent by the incident gamma ray discharged from the to-be-tested object, and photomultipliers converting the luminescence of the scintillators to a pulsed electric signal. For the radiation detector of the prior art, the scintillators one-by-one correspond to the photomultipliers. However, the following method is being adopted recently, in which the photomultipliers with the number less than that of the scintillators are combined with a plurality of scintillators. And according to the power ratio of the photomultipliers, the incident position of the gamma ray is determined, so as to improve the resolution (for example, refer to patent document 1).

FIG. 4 is a cross sectional view in the X direction (front view) obtained by viewing a conventional radiation detector 50 from the Y direction. When the radiation detector is an isotropic voxel detector, a cross sectional view in the Y direction (side view) of the conventional radiation detector 50, viewing from the X direction, also has the same shape as that of FIG. 4. The radiation detector 50 includes a scintillator array 12, which is divided by appropriately inserting a light reflective material 13 into 36 scintillators 11 that are two dimensionally and compactly arranged in a manner of six scintillators in the X direction and six scintillators in the Y direction; a light guide 14, which is optically combined with the scintillator array 12 and is divided into a plurality of small blocks, and includes embedded lattice frames combined with a light reflective material 15; and four photomultipliers 201, 202, 203, and 204 optically combined with the light guide 14. Additionally, in FIG. 8, only the photomultipliers 201 and 202 are shown, and the scintillators 11, for example, apply $Bi_4Ge_3O_{12}$ (BGO), $Gd_2SiO_5:Ce$ (GSO), $Lu_2SiO_5:Ce$ (LSO), $LuYSiO_5:Ce$ (LYSO), $LaBr_3:Ce$, $LaCl_3:Ce$, NaI, CsI:Na, $BaF_2$, CsF, $PbWO_4$, and other inorganic crystals.

If the gamma ray is incident on any one of the six scintillators 11 arranged in the X direction, the gamma ray is converted to visible light. The light is guided to the photomultipliers 201-204 through the optically combined light guide 14. At this time, the position, length, and angle of each light reflective material 15 in the light guide 14 are adjusted, such that the power ratio of the photomultiplier 201 (203) to the photomultiplier 202 (204) arranged in the X direction is changed according to a fixed ratio.

Particularly, when the power of the photomultiplier 201 is set to P1, the power of the photomultiplier 202 is set to P2, the power of the photomultiplier 203 is set to P3, and the power of the photomultiplier 204 is set to P4, and the position and the length of the light reflective material 15 are set, such that a calculated value $\{(P1+P3)-(P2+P4)\}/(P1+P2+P3+P4)$ representing a position in the X direction is changed in accordance with the position of each scintillator 11 at a fixed ratio.

In another aspect, for the six scintillators arranged in the Y direction, similarly the light is guided to the photomultipliers 201~204 through the optically combined light guide 14. That is, the position and the length of each light reflective material 15 in the light guide 14 are set, and the angle is adjusted under an inclined condition, such that the power ratio of the photomultiplier 201 (202) to the photomultiplier 203 (204) arranged in the Y direction is changed at a fixed ratio.

That is, the position and length of the light reflective material 15 are set, such that the calculated value $\{(P1+P2)-(P3+P4)\}/(P1+P2+P3+P4)$ representing a position in the Y direction is changed at a fixed ratio in accordance with the position of each scintillator.

In the conventional radiation detector 50, the light reflective material 13 between the scintillators 11 and the light reflective material 15 of the light guide 14 may use a silica and titania multi-layer film with a polyester film base material. The reflection efficiency of the multi-layer film is quite high, so the multi-layer film is used as a light reflective element. However, strictly speaking, a part of the light may be transmitted because of the incident angle of the light. Therefore, the shape and disposition of the light reflective material 13 and the light reflective material 15 are determined according to the transmission part of the light.

In addition, the scintillator array 12 is adhered to the light guide 14 by a coupling adhesive to form a coupling adhesive layer 16, and the light guide 14 is also adhered to the photomultipliers 201~204 by the coupling adhesive to form a coupling adhesive layer 17. Except for the surfaces optically combined with the photomultipliers 201~204, the peripheral surfaces which are not opposite to each scintillator 11 are covered by the light reflective material. At this time, the light reflective material mainly uses a polytetrafluoroethylene (PTFE) adhesive tape.

FIG. 5 is a block diagram of the structure of a position operating circuit of the radiation detector. The position operating circuit is formed by adders 21, 22, 23, 24, and position determining circuits 25 and 26. As shown in FIG. 5, in order to detect the incident position of the gamma ray in the X direction, the power P1 of the photomultiplier 201 and the power P3 of the photomultiplier 203 are input to the adder 21, and the power P2 of the photomuitiplier 202 and the power P4 of the photomultiplier 204 are input to the adder 22. The added powers (P1+P2) and (P3+P4) output by the two adders 21 and 22 are input to the position determining circuit 25, and the incident position of the gamma ray in the X direction is found out according to the two added powers.

Similarly, in order to detect the incident position of the gamma ray in the Y direction, the power P1 of the photomultiplier 201 and the power P2 of the photomultiplier 202 are input to the adder 23, and the power P3 of the photomultiplier 203 and the power P4 of the photomultiplier 204 are input to the adder 24. The added powers (P1+P2) and (P3+P4) output by the two adders 23 and 24 are input to the position determining circuit 26, and the incident position of the gamma ray in the Y direction is found out according to the two added powers.

In addition, the calculated value (P1+P2+P3+P4) represents the energy relative to the event, and is represented by an energy spectrum as shown in FIG. 6.

For the result calculated with the previous method, it is represented by a position coding map as shown in FIG. 7 according to the positions of the gamma ray incident on the scintillators, and the result also represents the determined information of each position.

In another aspect, methods for improving the spatial resolution by realizing block detectors having the depth of interaction (DOI) information are proposed, for example, a method of compactly disposing several layers of the scintillator arrays respectively formed by materials with different luminescence decay time (for example, please refer to non patent document 1), or a method of disposing each scintillator array in a manner of being spaced by a half pitch (for example, please refer to non patent document 2) and the like.

In a plurality of the examples in the prior art, the photomultiplier is used as a light receiving element receiving the light emitted by any scintillator. For the radiation detector 60 as shown in FIG. 8, semiconductor light receiving elements called avalanche photodiodes 301~304 are also used recently. The avalanche photodiodes are used in an avalanche state by applying a high electric field into a silicon depletion layer, so as to perform the signal amplification. A signal amplification degree of the avalanche photodiode is 50~100 times, which is smaller than the amplification degree of the photomultiplier of 105~106 times. However, the avalanche photodiode can be applied by using a low noise amplifier or in a low temperature environment. As the avalanche is generated in a thinner silicon depletion layer, compared with the photomultiplier, the avalanche photodiode serving as the light receiving element is quite thin, such that under a situation that the space is limited, it is extremely effective to a detector in the PET device.

Patent Document 1: Japanese Patent Publication Number 2004-354343

Non Patent Document 1: S. Yamamoto and H. Ishibashi, A GSO depth of interaction detector for PET, IEEE Trans. Nucl. Sci., 45:1078-1082, 1998.

Non Patent Document 2: H. Liu, T. Omura, M. Watanabe, et al., Development of a depth of interaction detector for g-rays, Nucl. Instr. Meth., Physics Research A 459:182-190, 2001.

However, the radiation detector of the examples in the prior art has the following problems.

In the radiation detector as shown in FIG. 4, the photomultipliers are used as light receiving elements receiving the light emitted by the scintillators. The photomultipliers are much larger than the scintillator array. For the detector in the PET device, there is a big problem under the situation that the space is limited. In addition, a plurality of electrodes or dynodes is complicatedly disposed in the photomultiplier, which cannot be realized at a low cost.

In another aspect, in the radiation detector as shown in FIG. 8, the avalanche photodiodes are used as light receiving elements receiving the light emitted by the scintillators. The avalanche photodiodes are quite thin and have a simple structure, so they can be fabricated to be compact. However, the signal amplification degree of the avalanche photodiodes is 50-100 times, which is smaller than the amplification degree of the photomultipliers of 105~106 times. Therefore, the avalanche photodiodes can be applied by using an expensive low noise amplifier and a dedicated temperature adjusting mechanism in the low temperature environment. In addition, the luminescence wavelength of the scintillator $LaBr_3$:Ce or $LaCl_3$:Ce with high performance, high luminescence, and high speed is 300~400 nm, which is a low wavelength band, and the quantum efficiency of the avalanche photodiodes in the wavelength band of 300~400 nm is 40~60%, such that the efficiency is poor.

SUMMARY OF THE INVENTION

In order to solve the problems, a radiation detector in claim 1 of the present invention includes a scintillator array for performing a light conversion on a radioactive ray, and light receiving elements, in which the light receiving elements include: a vacuum periphery, disposed on an opposite surface to an incident direction of the radioactive ray of the scintillator array, and being vacuum-sealed; a transparent electrode, disposed in the vacuum periphery; an avalanche multiplication film, formed on the transparent electrode, sandwiched between barrier layers and formed by amorphous selenium; and a field emission array, disposed opposite to the avalanche multiplication film, and having a plurality of field emission chips. The radiation detector is characterized in that electron beams always emitted from all the field emission chips of the field emission array, and the radiation detector reads signals in a pulse count mode.

In addition, according to the radiation detector of claim 1, the radiation detector of claim 2 is characterized in that a light guide for performing a light sharing adjustment is disposed between the scintillator array and the light receiving elements.

That is, the radiation detector has the light receiving elements receiving lights emitted by scintillators, performs a photoelectronc conversion by using the avalanche multiplication film formed by amorphous selenium, and reads the signals by using electron beams discharged from a plurality of electron beam discharging sources known as a field emission array. The avalanche multiplication film and the field emission array are disposed in the vacuum sealed vacuum periphery. In addition, a signal amplification degree of the avalanche, multiplication film formed by amorphous selenium is approximately 1000 times. Furthermore, even if $LaBr_3$:Ce or $LaCl_3$:Ce is used, the quantum efficiency of the avalanche multiplication film in the wavelength band of 300~400 nm is 70%. Compared with the photomultipliers or the avalanche photodiodes, the avalanche multiplication film has a high efficiency.

Effect of the Invention

As described above, when compared with the detector using the photomultiplier, the construction of the present invention is quite thin and simple. Additionally, the detector of the present invention is different from the photomultiplier requiring a plurality of electrodes; hence, the structure of the detector of the present invention is simple, and the detector can be realized at a low cost.

In addition, when compared with the detector using the avalanche photodiodes, the expensive low noise amplifier or dedicated temperature adjusting mechanism performing a low temperature operation is not required.

In addition, the radiation detector with a quite high sensitivity is provided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
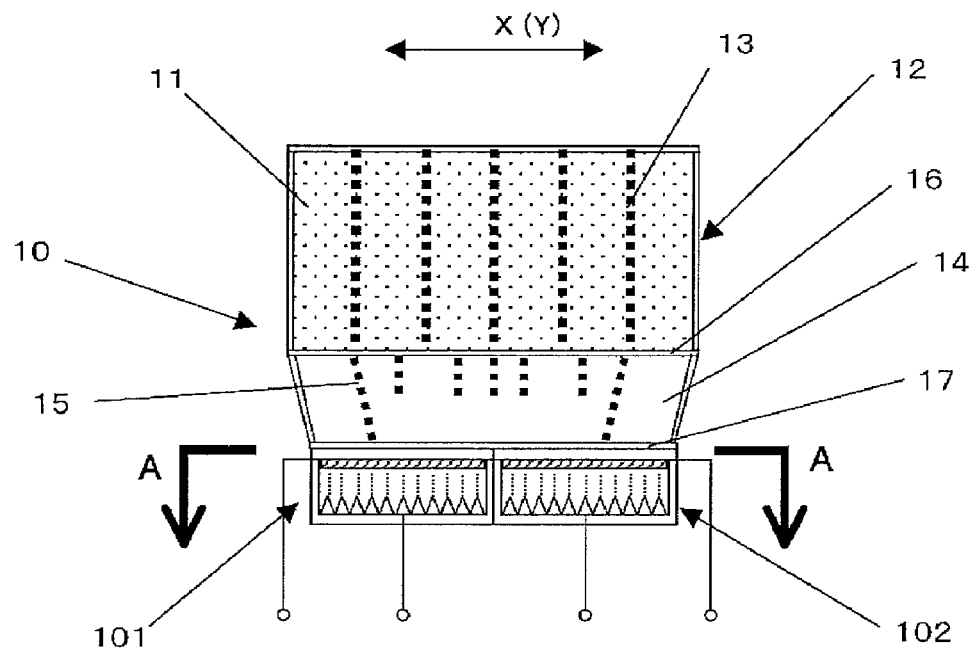
FIG. 1 is a cross-sectional view in the X direction of a radiation detector according to the present invention.

Reference will now be made in detail to the present embodiments of the invention, examples of which are illustrated in the accompanying drawings. Wherever possible, the same reference numbers are used in the drawings and the description to refer to the same or like parts.

(Embodiment) The drawings illustrate the structure of a radiation detector according to an embodiment of the present invention, and the detailed description thereof is provided according to the embodiment. FIG. 1 is a cross-sectional view in the X direction obtained by viewing a radiation detector 10 from the Y direction. In this embodiment, an isotropic voxel detector is described, so a cross-sectional view in the Y direction (side view) obtained by viewing the radiation detector 10 from the X direction also has the same shape as that of FIG. 1. The radiation detector 10 includes a scintillator array 12, which is divided, by appropriately inserting a light reflective material 13, into 36 scintillators 11 that are compactly arranged in two dimension in a manner of six scintillators in the X direction and six scintillators in the Y direction; a light guide 14, which is optically combined with the scintillator array 12 and is divided into a plurality of small blocks, and includes embedded lattice frames combined with a light reflective material 15; and four light receiving elements 101, 102, 103, and 104 optically combined with the light guide 14. In this embodiment, all the light receiving elements 101~104 are the same. Additionally, in FIG. 1, only the light receiving elements 101 and 102 are shown. In this embodiment, the scintillators 11 apply, for example, $Bi_4Ge_3O_{12}$ (BOO), $Gd_2SiO_5$:Ce (GSO), $Lu_2SiO_5$:Ce (LSO), $LuYSiO_5$:Ce (LYSO), $LaBr_3$:Ce, $LaC_3$:Ce, NaI, CsI:Na, $BaF_2$, CsF, $PbWO_4$, and other inorganic crystals.

If the gamma ray is incident on any one of the six scintillators 11 arranged in the X direction, the gamma ray is converted to visible light. The light is guided to the light receiving elements 101~104 through the optically combined light guide 14. At this time, the position, length, and angle of each light reflective material 15 in the light guide 114 are adjusted, such that the power ratio of the light receiving element 101 (103) to the light receiving element 102 (104) arranged in the X direction is changed at a fixed ratio.

Figure 2:
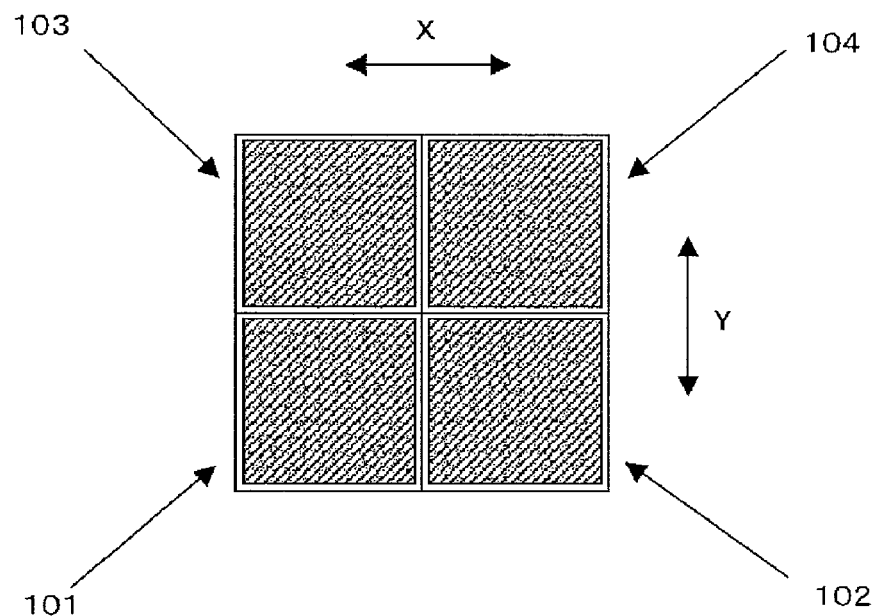
FIG. 2 is a cross-sectional view observed from an upper surface of the radiation detector according to the present invention.
Figure 3:
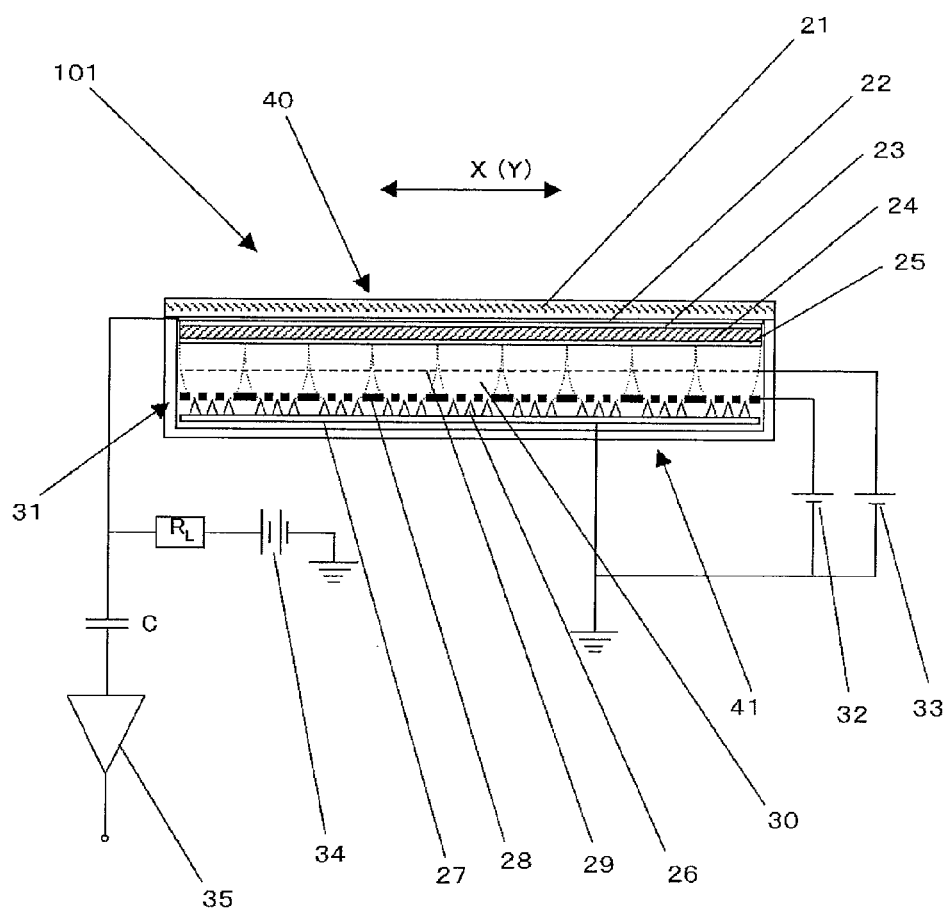
FIG. 3 is a detailed cross-sectional view of the radiation detector according to the present invention.
Figure 4:
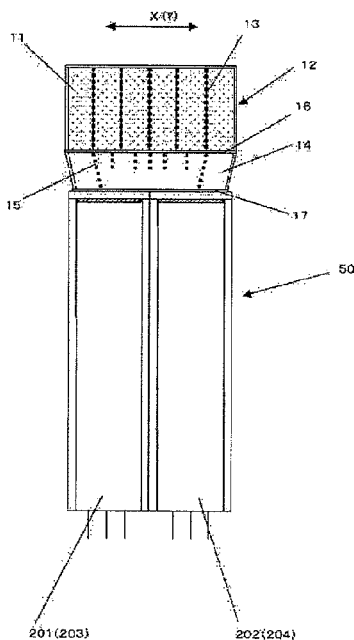
FIG. 4 is a cross-sectional view in the X direction of a conventional radiation detector.
Figure 5:
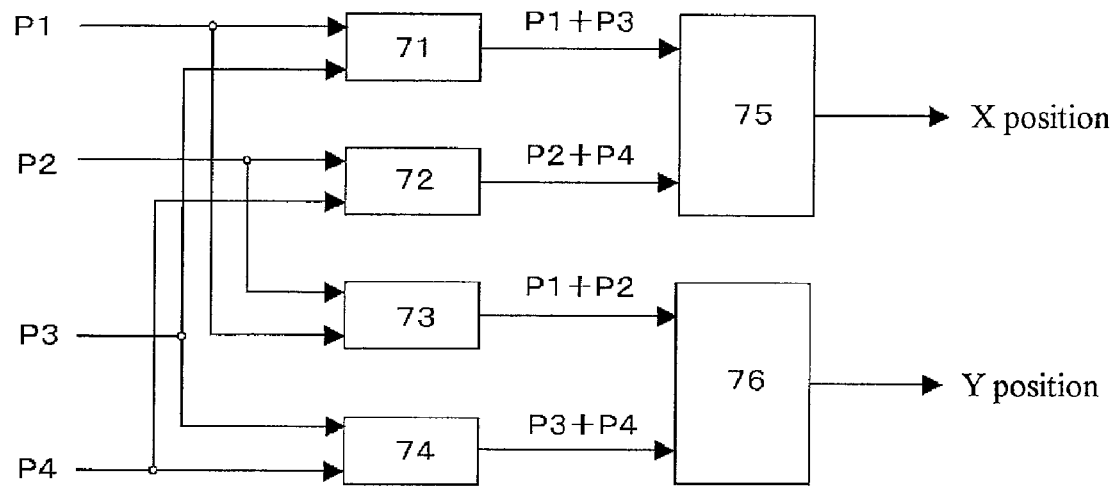
FIG. 5 shows an example of a position operating circuit of the radiation detector of the present invention and the conventional radiation detector.
Figure 6:
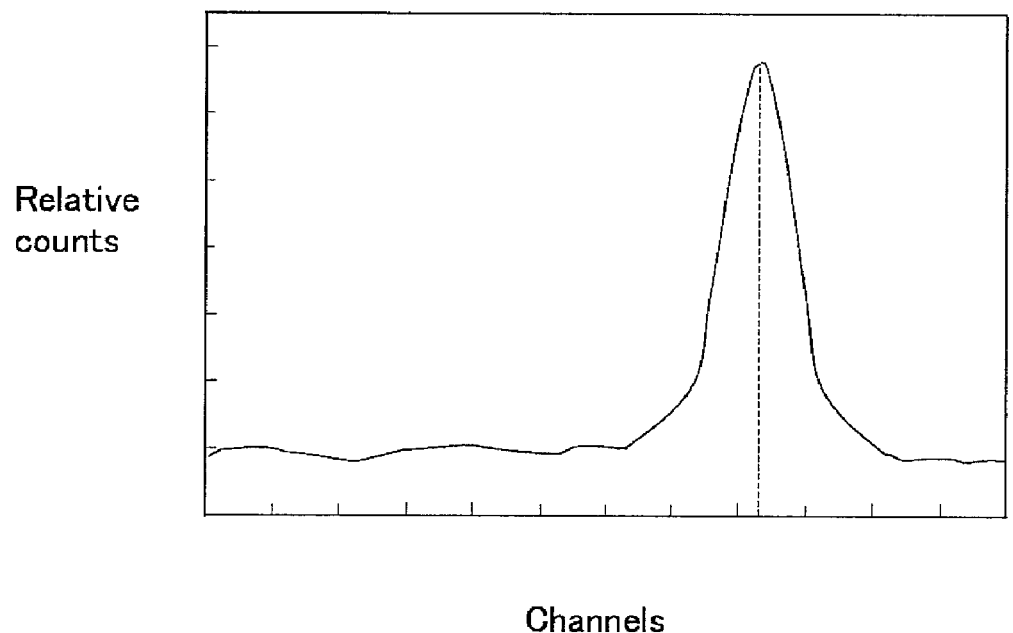
FIG. 6 shows an energy spectrum of the radiation detector of the present invention and the conventional radiation detector.
Figure 7:
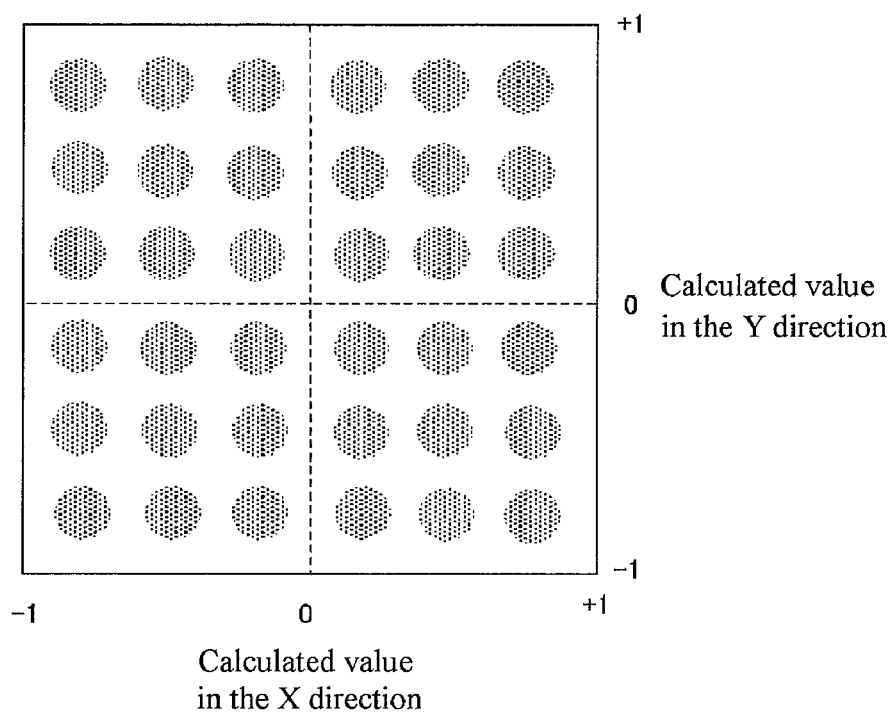
FIG. 7 is a position coding map of the radiation detector of the present invention and the conventional radiation detector.
Figure 8:
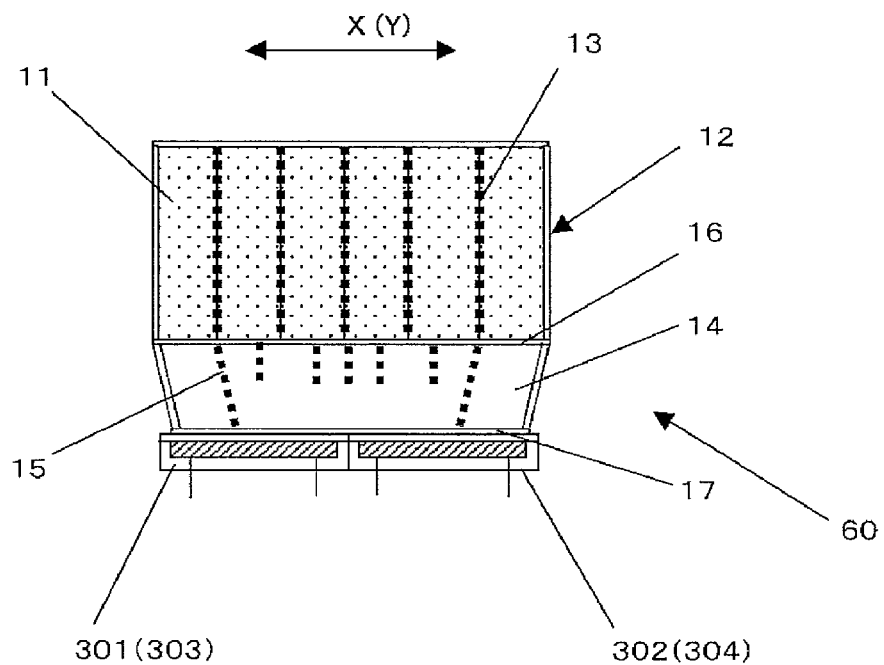
FIG. 8 is a cross-sectional view in the X direction of the conventional radiation detector.

FIG. 2 is a sectional view of FIG. 1 taken along A-A, which is obtained by viewing the light receiving elements 101, 102, 103, and 104 of the present invention from an upper surface. In addition, FIG. 3 shows the light receiving element 101 (102, 103, and 104 are the same, so only the light receiving element 101 is shown (as a representative) in detail. In FIG. 3, an anode 40 includes a transparent glass panel 21; a transparent electrode 22, formed on the transparent glass panel 21; a hole injection barrier layer 23, formed on the transparent electrode 22; an avalanche multiplication film 24, formed on the hole injection barrier layer 23 and formed by amorphous selenium; and an electron injection barrier layer 25, formed on the avalanche multiplication film 24. In another aspect, a cathode 41 is formed in the following manner. A field emission array 27 formed by a plurality of field emission chips 26 is disposed opposite to the anode 40, and a shared gate electrode bias 32 is applied on a shared gate electrode 28, such that all the field emission chips 26 constantly radiate electron beam 30 towards the anode 40. At this time, the electron beam 30 reaches the anode in a manner of soft landing after being decelerated by a mesh electrode 29. A mesh electrode bias 33 is applied on the mesh electrode 29. In order to vacuum-seal the anode 40 including the avalanche multiplication film 24 and the cathode 41 including the field emission array 27, the anode 40 and the cathode 41 are assembled in a vacuum periphery 31. An actual, distance between the avalanche multiplication film 24 and the field emission array 27 is approximately from 1 mm to 2 mm, so the light receiving element 101 is quite thin.

In this embodiment, if the gamma ray is incident on any one of the scintillators 11, the gamma ray is converted to the visible light. The light is guided to the light receiving elements 101~104 through the optically combined light guide 14. After passing through the transparent glass panel 21 and the transparent electrode 22 in each light receiving element, the light reaches the avalanche multiplication film 24 formed by amorphous selenium, and generates electron-hole pairs through a photoelectronc conversion. A bias 34 is applied on the avalanche multiplication film 24. In the film, signal is amplified when hole moves from the anode 40 to the cathode 41, and the amplified a hole is_opposite to the field emission array 27 on the surface of the avalanche multiplication film 24. The electron beam 30 is usually radiated from the field emission array 27, so the amplified hole is immediately scanned and read by an amplifier 35.

At this time, when the thickness of the avalanche multiplication film 24 is set to 35 μm, and the applied voltage of the bias 34 is set to 3500 V, the signal amplification degree can be up to 1000 times, so as to detect the gamma ray with a high sensitivity.

As described above, in the radiation detector of the present invention, the avalanche multiplication film 24 and the field emission array 27 are disposed in the vacuum-sealed vacuum periphery 31. Therefore, the radiation detector of the present invention is quite thin, and the structure of the radiation detector is simple. Compared with the detector using the photomultipliers, the radiation detector of the present invention can be compactly formed. Therefore, even if under a situation that the space is limited, the present invention can still function as an effective detector in a PET device. The detector of the present invention is different from the photomultiplier requiring a plurality of electrodes; hence, the structure is simple, and the detector can be realized at a low cost.

In addition, for the avalanche multiplication film formed by amorphous selenium, the signal amplification degree can be up to 1000 times; hence, the avalanche multiplication film has a high sensitivity. Accordingly, the expensive low noise amplifier or the dedicated temperature adjusting mechanism performing the low temperature operation required in the avalanche photodiode is no longer needed. Even $LaBr_3$:Ce or $LaCl_3$:Ce or other high performance scintillators with high luminescence and high speed are used, the quantum efficiency of the avalanche multiplication film of the scintillator with the luminescence wavelength in the wavelength band of 300~400 nm is also up to 70%, so compared with the photomultipliers or the avalanche photodiodes, the avalanche multiplication film has a high efficiency for the scintillators to perform effectively.

INDUSTRIAL AVAILABILITY

As described above, the present invention is suitable for medical and industrial radioactive photographing devices.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claim is:

1. A radiation detector, comprising a scintillator array, performing a light conversion on a radioactive ray, and light receiving elements, wherein the light receiving elements comprise:

a vacuum periphery, disposed on an opposite surface to an incident direction of the radioactive ray of the scintillator array, and being vacuum-sealed;

a transparent electrode, disposed in the vacuum periphery;

an avalanche multiplication film, formed on the transparent electrode, sandwiched between barrier layers and formed by amorphous selenium; and a field emission array, disposed opposite to the avalanche multiplication film and comprising a plurality of field emission chips, wherein electron beams constantly discharge from all the field emission chips of the field emission array, and the radiation detector reads signals in a pulse count mode.

2. The radiation detector according to claim 1, wherein a light guide for performing light sharing adjustment is disposed between the scintillator array and the light receiving elements.

* * * * *